(12) United States Patent
Seong

(10) Patent No.: US 9,160,285 B2
(45) Date of Patent: Oct. 13, 2015

(54) SIGNAL AMPLIFIER HAVING INVERTED TOPOLOGY

(71) Applicant: SAMSUNG ELECTRO-MECHANICS CO., LTD., Suwon-Si, Gyeonggi-Do (KR)

(72) Inventor: Nack Gyun Seong, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/279,081

(22) Filed: May 15, 2014

(65) Prior Publication Data

US 2015/0171802 A1 Jun. 18, 2015

(30) Foreign Application Priority Data

Dec. 12, 2013 (KR) .................. 10-2013-0154554

(51) Int. Cl.
*H03F 3/18* (2006.01)
*H03F 3/19* (2006.01)
*H03F 3/24* (2006.01)
*H03F 1/56* (2006.01)
*H03F 3/21* (2006.01)

(52) U.S. Cl.
CPC .. *H03F 3/19* (2013.01); *H03F 1/56* (2013.01); *H03F 3/211* (2013.01); *H03F 3/245* (2013.01); *H03F 2200/451* (2013.01); *H03F 2203/21139* (2013.01); *H03F 2203/21142* (2013.01)

(58) Field of Classification Search
USPC .......................................... 330/262–276, 311
See application file for complete search history.

(56) References Cited

U.S. PATENT DOCUMENTS

| | | | |
|---|---|---|---|
| 6,674,337 B2 | 1/2004 | Hashemi et al. | |
| 8,610,504 B2 * | 12/2013 | Rabjohn | ........................ 330/295 |
| 8,830,000 B2 * | 9/2014 | Jeong et al. | .................... 330/311 |
| 2012/0154305 A1 | 6/2012 | Nunomaki | |

FOREIGN PATENT DOCUMENTS

| | | |
|---|---|---|
| KR | 10-0860794 B1 | 9/2008 |
| KR | 10-2012-0070500 A | 6/2012 |

* cited by examiner

*Primary Examiner* — Hieu Nguyen
(74) *Attorney, Agent, or Firm* — NSIP Law

(57) ABSTRACT

A signal amplifier having an inverted topology may include: a first common source-type amplifying unit connected to a power supply terminal and amplifying a first band signal among input signals; a second common source-type amplifying unit connected to a ground terminal and amplifying a second band signal among input signals; and an output matching unit performing impedance matching with respect to a first band between the first common source-type amplifying unit and an output terminal and performing impedance matching with respect to a second band between the second common source-type amplifying unit and the output terminal. The first common source-type amplifying unit, the output matching unit, and the second common source-type amplifying unit may form a single current path between the power supply terminal and the ground terminal.

20 Claims, 10 Drawing Sheets

SIGNAL AMPLIFIER HAVING INVERTED TOPOLOGY

CROSS-REFERENCE TO RELATED APPLICATION

This application claims the benefit of Korean Patent Application No. 10-2013-0154554 filed on Dec. 12, 2013, with the Korean Intellectual Property Office, the disclosure of which is incorporated herein by reference.

BACKGROUND

The present disclosure relates to a signal amplifier having an inverted topology.

In general, as demand for wireless communications devices and standards governing the use thereof have increased, demand for multi-band transceivers capable of simultaneously processing signals within various bands in a single portable device has increased.

For example, a wireless local area network (WLAN) may simultaneously use 2.4 GHz and 5 GHz bands, while the domestic Korean long term evolution (LTE) band simultaneously uses the 800 MHz, 900 MHz, 1800 MHz, and 2.1 GHz bands.

Thus, a device capable of transmitting and receiving multi-band signals with a single radio frequency (RF) front-end module is required, and in particular, a technique of processing signals within several frequencies with a single low-noise amplifier (LNA) disposed within a front stage of a receiver is required.

Here, an LNA supporting a concurrent dual-band capable of simultaneously processing signals within two different bands may have a cascode or cascade structure.

In general, an amplifier having a cascode structure includes two transistors stacked between a power source terminal and a ground, and since such an amplifier only has a single current path, only a small amount of current is consumed thereby; however, since such an amplifier includes a common gate amplifier, gain characteristics of which may not be optimal, and a common source amplifier having excellent gain characteristics, gain characteristics thereof require improvement.

Also, such an amplifier having a cascade structure includes at least two-stage amplifying units between an input terminal and an output terminal. The amplifying units in the respective stages may be configured as common source amplifiers having excellent gain characteristics, but two or more current paths thereof consume relatively large amounts of power, requiring improvement in terms of power consumption.

Patent Document 1 relates to a dual-band LNA. This related art document, however, does not disclose technical matters regarding an inverted structure using a common source-type amplifier.

RELATED ART DOCUMENT (Patent Document 1) Korean Patent Laid-Open Publication No. 2012-0070500

SUMMARY

An aspect of the present disclosure may provide a signal amplifier using inverted topology using a common source-type amplifier.

According to a first aspect of the present disclosure, a signal amplifier may include: a first common source-type amplifying unit connected to a power supply terminal and amplifying a first band signal among input signals; a second common source-type amplifying unit connected to a ground terminal and amplifying a second band signal among input signals; and an output matching unit performing impedance matching with respect to a first band between the first common source-type amplifying unit and an output terminal and performing impedance matching with respect to a second band between the second common source-type amplifying unit and the output terminal, wherein the first common source-type amplifying unit, the output matching unit, and the second common source-type amplifying unit may form a single current path between the power supply terminal and the ground terminal.

According to a second aspect of the present disclosure, a signal amplifier may include: a first common source-type amplifying unit connected to a power supply terminal and amplifying a first band signal among input signals; a second common source-type amplifying unit connected to a ground terminal and amplifying a second band signal among input signals; and an output matching unit performing impedance matching with respect to a first band between the first common source-type amplifying unit and an output terminal and performing impedance matching with respect to a second band between the second common source-type amplifying unit and the output terminal, wherein the first common source-type amplifying unit, the output matching unit, and the second common source-type amplifying unit may have a cascode structure stacked between the power supply terminal and the ground terminal.

According to a third aspect of the present disclosure, a signal amplifier may include: an input filter unit connected to an input terminal and allowing first and second band signals among input signals to pass therethrough; a first common source-type amplifying unit connected to a power supply terminal and amplifying the first band signal; a second common source-type amplifying unit connected to a ground terminal and amplifying the second band signal; and an output matching unit performing impedance matching with respect to a first band between the first common source-type amplifying unit and an output terminal and performing impedance matching with respect to a second band between the second common source-type amplifying unit and the output terminal, wherein the first common source-type amplifying unit, the output matching unit, and the second common source-type amplifying unit may form a single current path between the power supply terminal and the ground terminal.

According to a fourth aspect of the present disclosure, a signal amplifier may include: an input filter unit connected to an input terminal and allowing first and second band signals among input signals to pass therethrough; a first common source-type amplifying unit connected to a power supply terminal and amplifying the first band signal; a second common source-type amplifying unit connected to a ground terminal and amplifying the second band signal; and an output matching unit performing impedance matching with respect to a first band between the first common source-type amplifying unit and an output terminal and performing impedance matching with respect to a second band between the second common source-type amplifying unit and the output terminal, wherein the first common source-type amplifying unit, the output matching unit, and the second common source-type amplifying unit may have a cascode structure stacked between the power supply terminal and the ground terminal.

In the third and fourth aspects of the present disclosure, the input filter unit may include: a first filter including an LC parallel circuit connected to a signal line connected to the input terminal, and allowing the first and second bands to pass therethrough and rejecting a frequency band between the first and second bands; and a second filter including an LC series circuit connected between the signal line and a ground, and allowing the first and second bands to pass therethrough and bypassing a frequency band between the first and second bands to the ground.

In the first, second, third, and fourth aspects of the present disclosure, the first common source-type amplifying unit may include a PMOS transistor having a source connected to the power supply terminal, a gate connected to a first gate voltage terminal and receiving the input signal, and a drain providing a signal to the output matching unit.

The second common source-type amplifying unit may include an NMOS transistor having a source connected to the ground terminal, a gate connected to a second gate voltage terminal and receiving the input signal, and a drain providing a signal to the output matching unit.

The output matching unit may include: a first inductor connected between an output terminal of the first common source-type amplifying unit and a common node and having inductance for first band matching; a second inductor connected between an output terminal of the second common source-type amplifying unit and the common node and having inductance for second band matching; and a shared capacitor connected between the common node and the output terminal of the output matching unit and having capacitance for the first and second band matching.

According to a fifth aspect of the present disclosure, a signal amplifier may include: an input filter unit connected to an input terminal and allowing first and second band signals among input signals to pass therethrough; a first common source-type amplifying unit connected to a power supply terminal and amplifying the first band signal; a second common source-type amplifying unit connected to a ground terminal and amplifying the second band signal; and an output matching unit including a first output matching circuit performing impedance matching with respect to a first band between the first common source-type amplifying unit and an output terminal and a second output matching circuit performing impedance matching with respect to a second band between the second common source-type amplifying unit and the output terminal, wherein the first common source-type amplifying unit, the output matching unit, and the second common source-type amplifying unit may have an inverted structure stacked between the power supply terminal and the ground terminal, and the output matching unit may include: a first inductor connected to an output terminal of the first common source-type amplifying unit and a common node and having inductance for first band matching; a second inductor connected between an output terminal of the second common source-type amplifying unit and the common node and having inductance for second band matching; and a shared capacitor connected between the common node and the output terminal of the output matching unit and having capacitance for the first and second band matching.

In the fifth aspect of the present disclosure, the first common source-type amplifying unit may include a PMOS transistor having a source connected to the power supply terminal, a gate connected to a first gate voltage terminal and receiving the input signal, and a drain providing a signal to the output matching unit, and the second common source-type amplifying unit may include an NMOS transistor having a source connected to the ground terminal, a gate connected to a second gate voltage terminal and receiving the input signal, and a drain providing a signal to the output matching unit.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
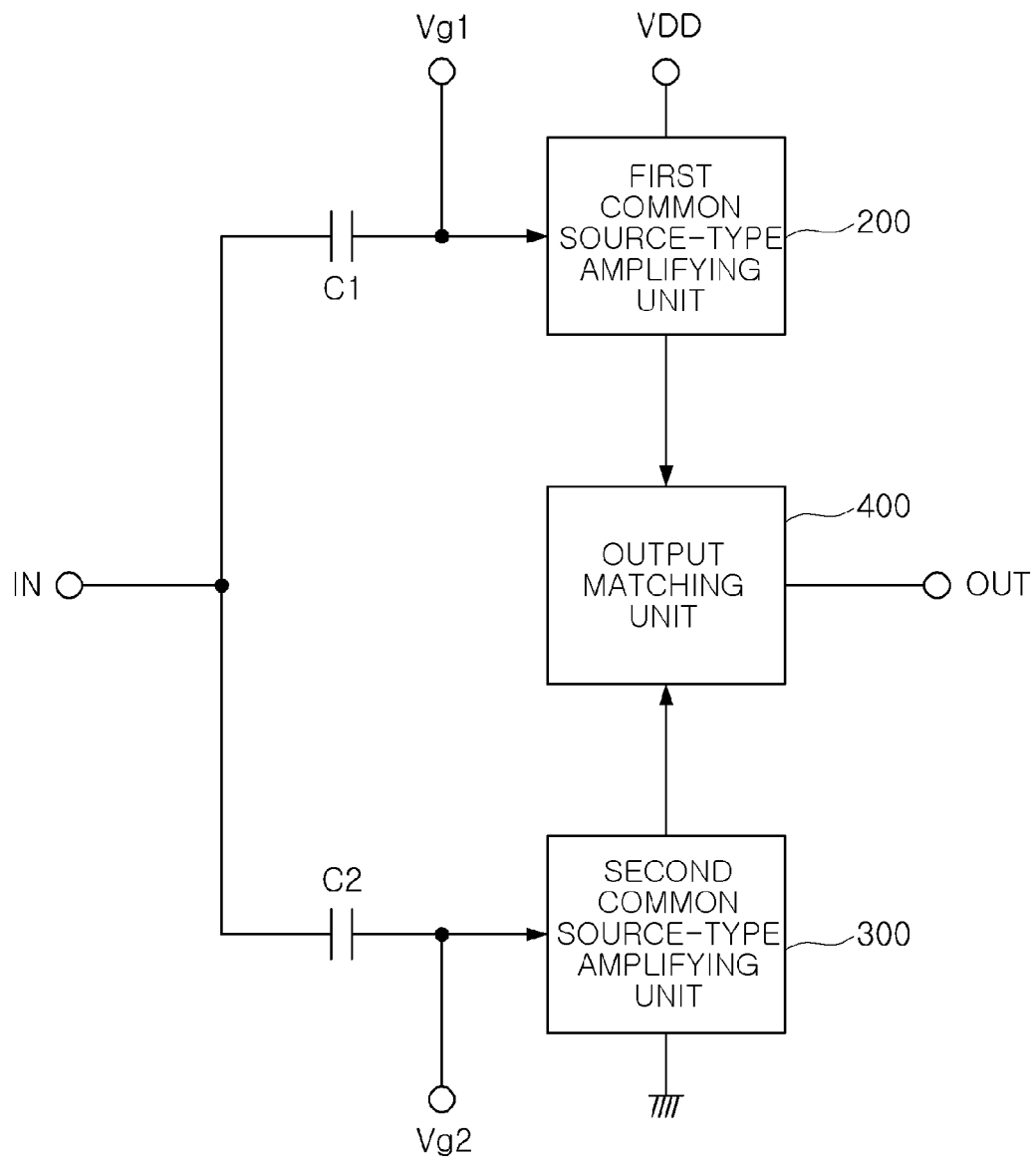
FIG. 1 is a view illustrating a configuration of a first example of a signal amplifier according to an exemplary embodiment of the present disclosure.

Hereinafter, embodiments of the present disclosure will be described in detail with reference to the accompanying drawings. The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. Throughout the drawings, the same or like reference numerals will be used to designate the same or like elements.

Figure 2:
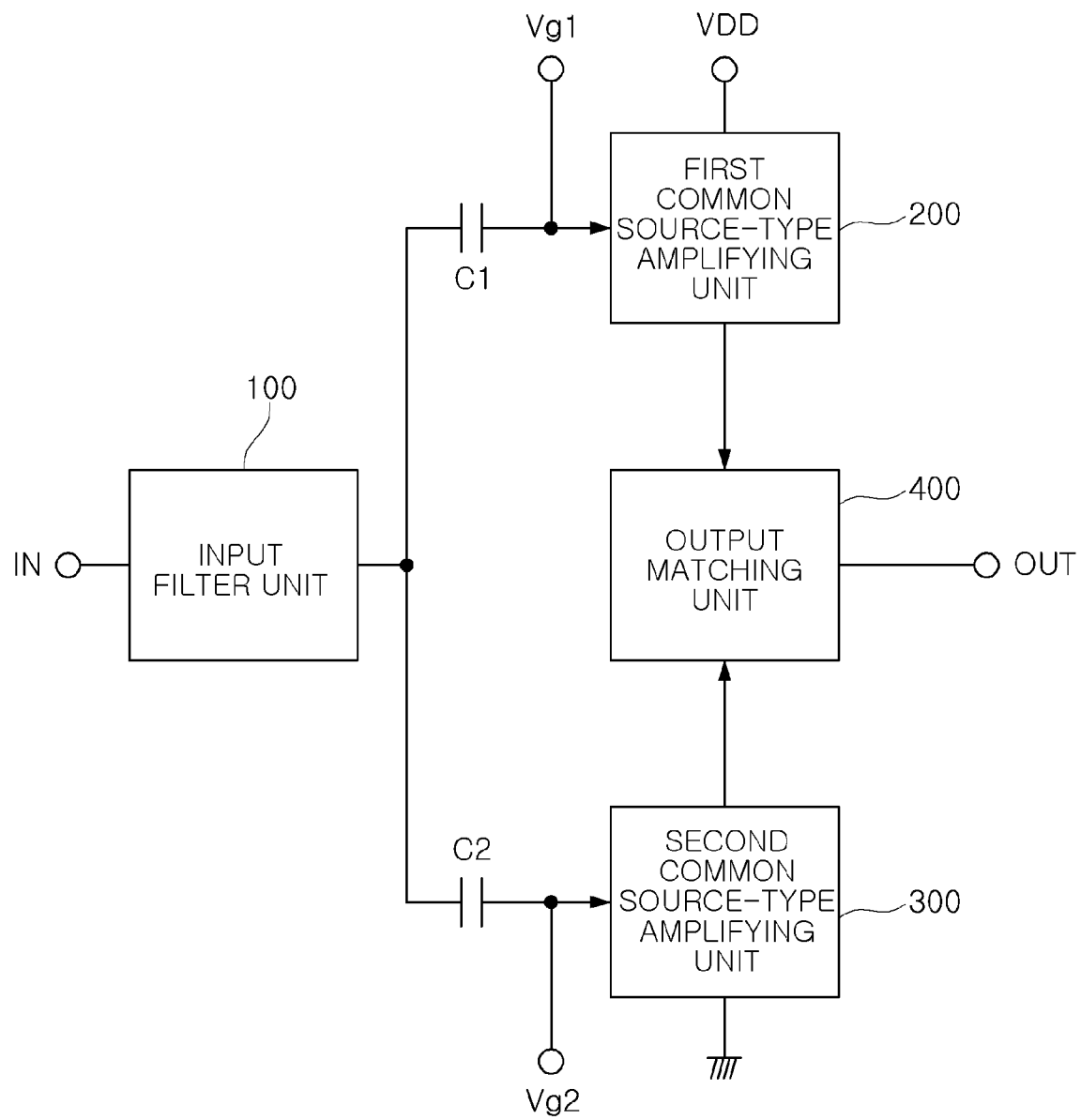
FIG. 2 is a view illustrating a configuration of a second example of a signal amplifier according to an exemplary embodiment of the present disclosure.

FIG. 1 is a view illustrating a configuration of a first example of a signal amplifier according to an exemplary embodiment of the present disclosure, and FIG. 2 is a view illustrating a configuration of a second example of a signal amplifier according to an exemplary embodiment of the present disclosure.

Referring to FIG. 1, a signal amplifier according to an exemplary embodiment of the present disclosure may include a first common source-type amplifying unit 200, a second common source-type amplifying unit 300, and an output matching unit 400.

Referring to FIG. 2, a signal amplifier according to an exemplary embodiment of the present disclosure may include an input filter unit 100, a first common source-type amplifying unit 200, a second common source-type amplifying unit 300, and an output matching unit 400.

Referring to FIGS. 1 and 2, the first common source-type amplifying unit 200, the output matching unit 400, and the second common-source type amplifying unit 300 may have a cascode structure, being stacked between a power supply terminal VDD and a ground terminal.

Thus, the first common source-type amplifying unit 200, the output matching unit 400, and the second common-source type amplifying unit 300 may form a single current path between the power supply terminal VDD and the ground terminal. Thus, current consumption may be reduced.

Referring to FIG. 2, the input filter unit 100 may be connected to an input terminal IN to allow a first band signal and a second band signal, among input signals, to pass therethrough.

The input filter unit 100 may be configured by using at least one of a high pass filter, a low pass filter, a band-reject filter such as a notch filter, a band suppression filter, or the like.

Referring to FIGS. 1 and 2, the first common source-type amplifying unit 200 may be connected to the power supply terminal VDD to amplify a first band signal among input signals.

Also, the second common source-type amplifying unit 300 may be connected to the ground terminal to amplify a second band signal among input signals.

The output matching unit 400 may perform impedance matching with respect to a first band between the first common source-type amplifying unit 200 and the output terminal OUT, and perform impedance matching with respect to a second band between the second common source-type amplifying unit 300 and the output terminal OUT.

Meanwhile, the signal amplifier according to the exemplary embodiment of the present disclosure may operate as a concurrent dual-band low-noise amplifier. In this case, input signals may include a first band signal and a second band signal, and here, the first band signal may be a low band signal and the second band signal may be a high band signal.

For example, in a case in which the signal amplifier according to the exemplary embodiment of the present disclosure is applied to a Wi-Fi communications module, a first band signal may be a 2.4 GHz band signal, while a second band signal may be a 5 GHz band signal.

In another example, in a case in which the signal amplifier according to the exemplary embodiment of the present disclosure is applied to a cellular phone using a long term evolution (LTE) band, a first band signal may be a 850 MHz band signal, while a second band signal may be a 1900 MHz band signal.

Figure 3:
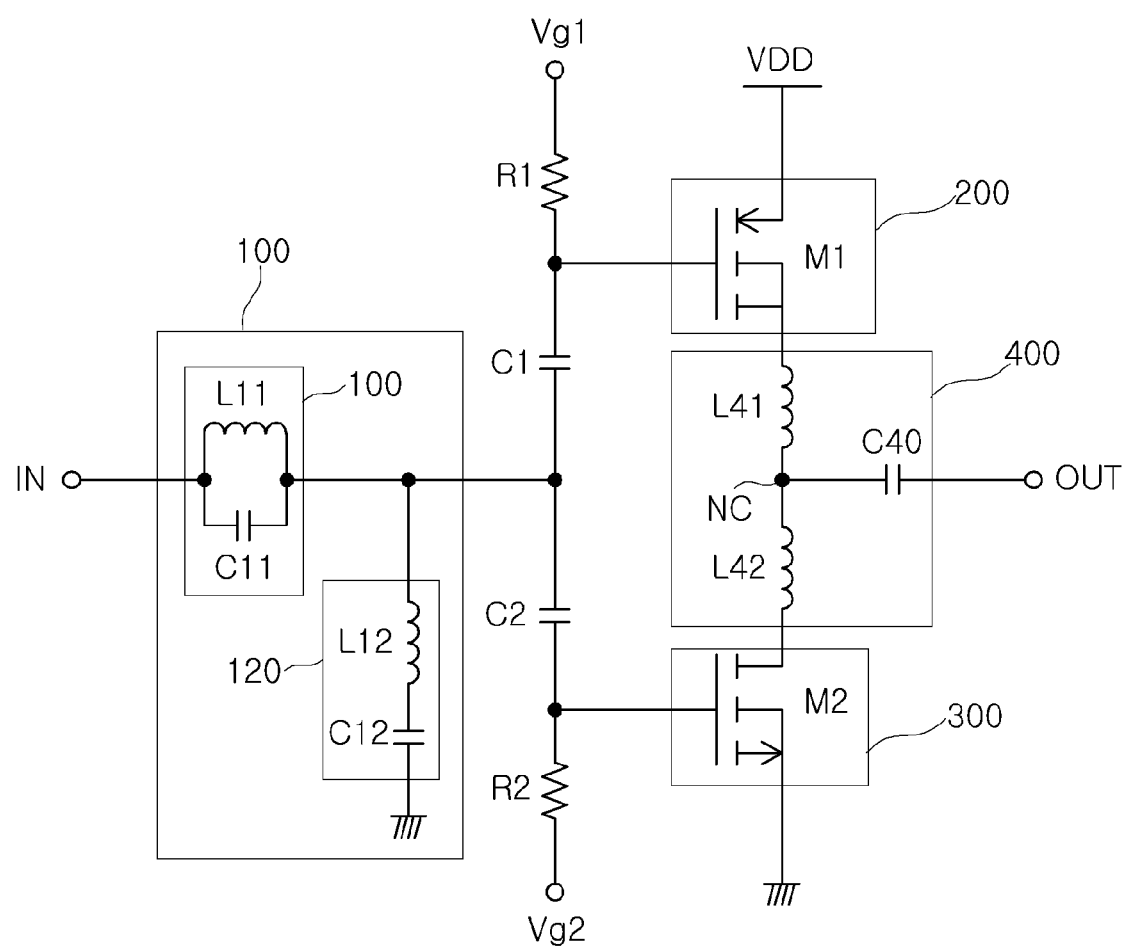
FIG. 3 is a circuit diagram of a signal amplifier according to an exemplary embodiment of the present disclosure.

FIG. 3 is a circuit diagram of a signal amplifier according to an exemplary embodiment of the present disclosure.

Referring to FIG. 3, the input filter unit 100 may have a second order or higher filter structure. For example, the input filter unit 100 may include a first filter 110 and a second filter 120.

The first filter 110 may include an LC parallel circuit connected to a signal line connected to the input terminal to allow the first and second bands to pass therethrough and reject a frequency band between the first and second bands.

Also, the second filter 120 may include an LC series circuit connected between the signal line and a ground to allow the first and second bands to pass therethrough and bypass a frequency band between the first and second bands to the ground.

The first common source-type amplifying unit 200 may include a PMOS transistor M1 having a source connected to the power supply terminal VDD, a gate connected to a first gate voltage Vg1 and receiving the input signal, and a drain providing a signal to the output matching unit 400.

In this case, the PMOS transistor M1 may be operated by the first gate voltage Vg1 to amplify a first band signal among input signals input through the input filter unit 100 and a first capacitor C1 and provide the amplified first band signal to the output matching unit 400. Here, the first gate voltage Vg1 may be a voltage capable of turning on the PMOS transistor M1, which may be 0V.

The second common source-type amplifying unit 300 may include an NMOS transistor M2 having a source connected to the ground terminal, a gate connected to a second gate voltage Vg2 and receiving the input signal, and a drain providing a signal to the output matching unit 400.

In this case, the NMOS transistor M2 may be operated by the second gate voltage Vg2 to amplify a second band signal among input signals input through the input filter unit 100 and a second capacitor C2 and provide the amplified second band signal to the output matching unit 400 through the drain thereof. Here, the second gate voltage Vg2 may be a voltage capable of turning on the NMOS transistor M2, which may be 0.7V.

Since the first common source-type amplifying unit 200 and the second common source-type amplifying unit 300 have the above-described circuit configurations, for example, the first common source-type amplifying unit 200 includes the PMOS transistor M1 and the second common source-type amplifying unit 300 includes the NMOS transistor M2, the first common source-type amplifying unit 200 and the second common source-type amplifying unit 300 may have an inverted structure.

The output matching unit 400 may include a first inductor L41 connected between an output terminal of the first common source-type amplifying unit 200 and a common node NC and having inductance for first band matching, a second inductor L42 connected between an output terminal of the second common source-type amplifying unit 300 and the common node NC and having inductance for second band matching, and a shared capacitor C40 connected between the common node NC and the output terminal OUT and having capacitance for the first and second band matching.

In this case, the first inductor L41 may contribute to impedance matching with respect to the first band signal together with the shared capacitor C40 and parasitic capacitance of the first common source-type amplifying unit 200.

Also, the first inductor L42 may contribute to impedance matching with respect to the second band signal together with the shared capacitor C40 and parasitic capacitance of the second common source-type amplifying unit 300.

In FIGS. 1, 2, and 3, C1 and C2 are DC blocking capacitors, and R1 and R2 are bias resistors.

Figure 4:
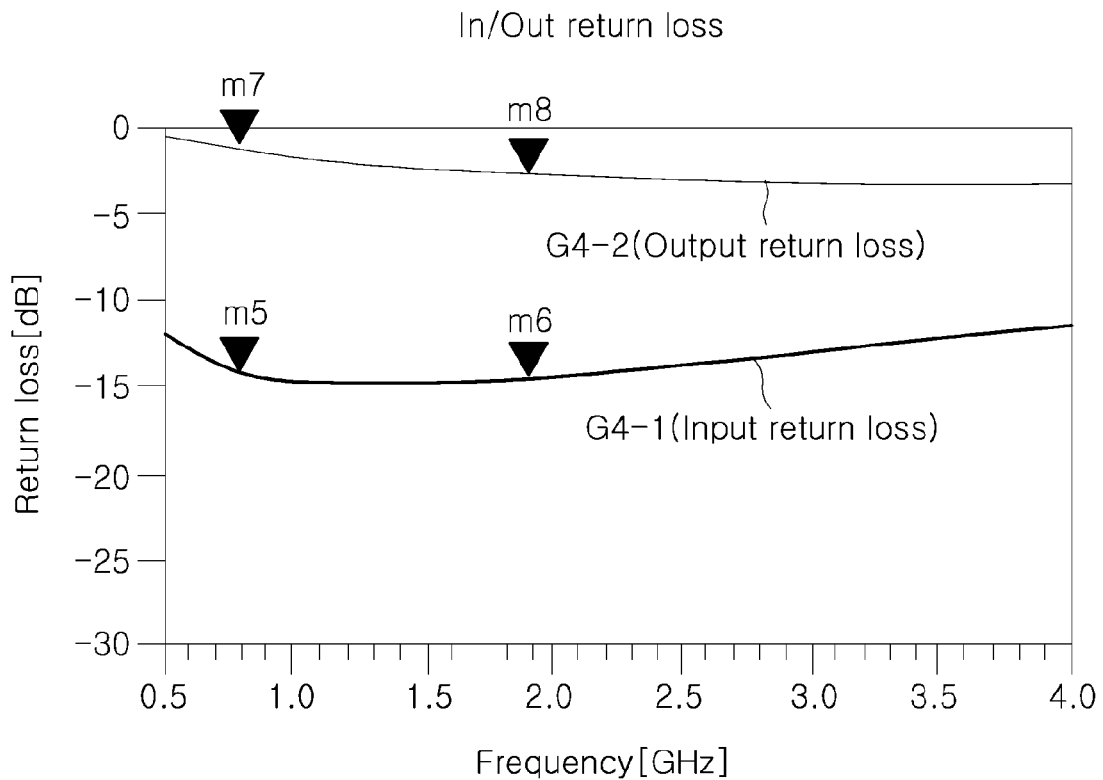
FIG. 4 is a graph illustrating input/output return loss in a case in which an input filter unit is not provided according to an exemplary embodiment of the present disclosure.
Figure 5:
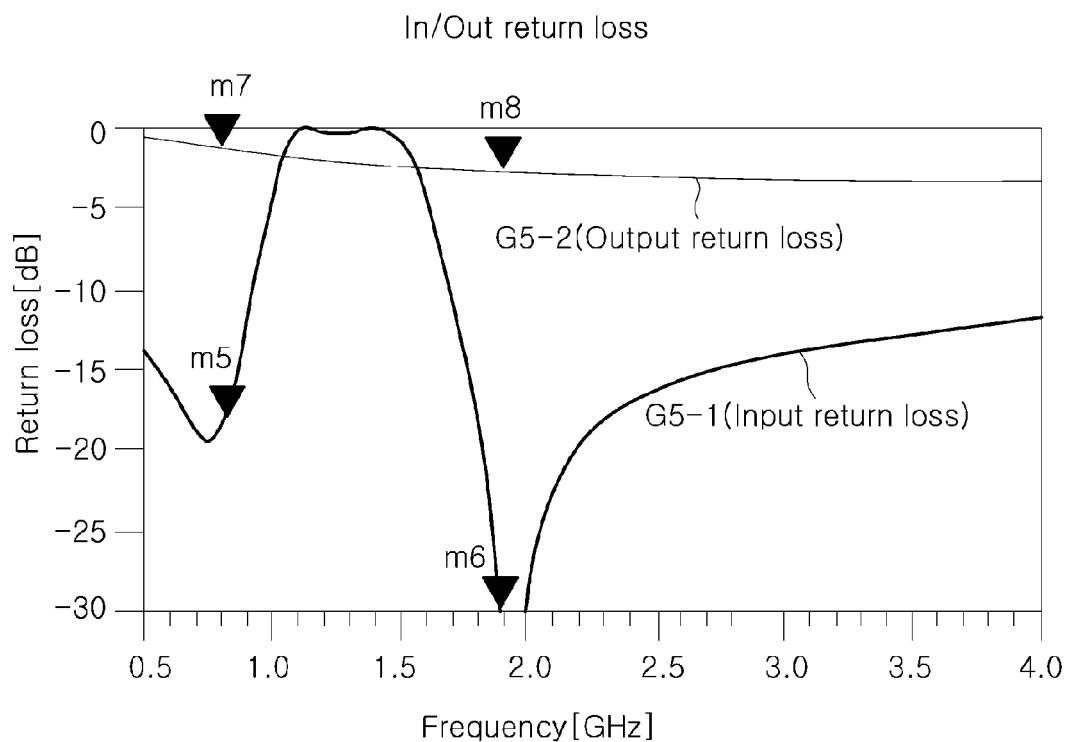
FIG. 5 is a graph illustrating input/output return loss in a case in which an input filter unit is provided according to an exemplary embodiment of the present disclosure.

FIG. 4 is a graph illustrating input/output return loss (or In/Out return loss) in a case in which an input filter unit is not provided according to an exemplary embodiment of the present disclosure, and FIG. 5 is a graph illustrating input/output return loss in a case in which an input filter unit is provided according to an exemplary embodiment of the present disclosure.

FIGS. 4 and 5 illustrate input/output return loss characteristics in a case in which the signal amplifier according to the exemplary embodiment of the present disclosure is applied to an LTE phone.

In FIG. 4, G4-1 is an input return loss characteristics graph and G4-2 is an output return loss characteristics graph. Referring to the two characteristics graphs, it can be seen that a low band signal of 850 MHz and a high band signal of 1900 MHz have a degree of return loss above −15 dB, respectively.

In FIG. 5, G5-1 is an input return loss characteristics graph and G5-2 is an output return loss characteristics graph. Referring to the two characteristics graphs, it can be seen that, in the case of using the input filter unit 100 according to the exemplary embodiment of the present disclosure, a low band signal of 850 MHz and a high band signal of 1900 MHz have a degree of return loss below −15 dB, respectively.

Figure 6:
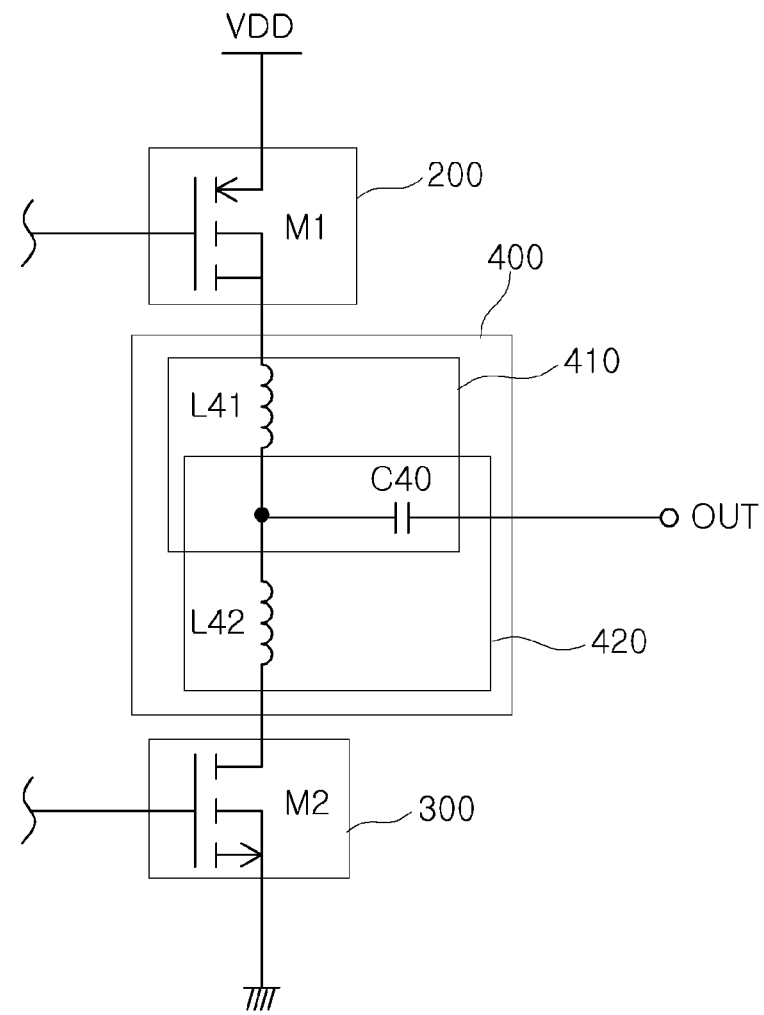
FIG. 6 is a view illustrating an output matching unit according to an exemplary embodiment of the present disclosure.

FIG. 6 is a view illustrating an output matching unit according to an exemplary embodiment of the present disclosure.

Referring to FIG. 6, the output matching unit 400 may include a first output matching circuit 410 and a second output matching circuit 420.

The first output matching circuit 410 may include a first inductor L41 and a shared capacitor C40. Here, the first output matching circuit 410 may adjust impedance by parasitic capacitance between the gate and the drain of the PMOS transistor M1 included in the first common source-type amplifying unit 200, inductance of the first inductor L41, and capacitance of the shared capacitor C40.

The second output matching circuit 420 may include a second inductor L42 and the shared capacitor C40.

Here, the second output matching circuit 420 may adjust impedance by parasitic capacitance between the gate and the drain of the NMOS transistor M2 included in the second common source-type amplifying unit 300, inductance of the second inductor L42, and capacitance of the shared capacitor C40.

As described above, the output matching unit 400 according to the exemplary embodiment of the present disclosure may perform impedance matching with respect to a concurrent dual-band including a low band and a high band.

Figure 7:
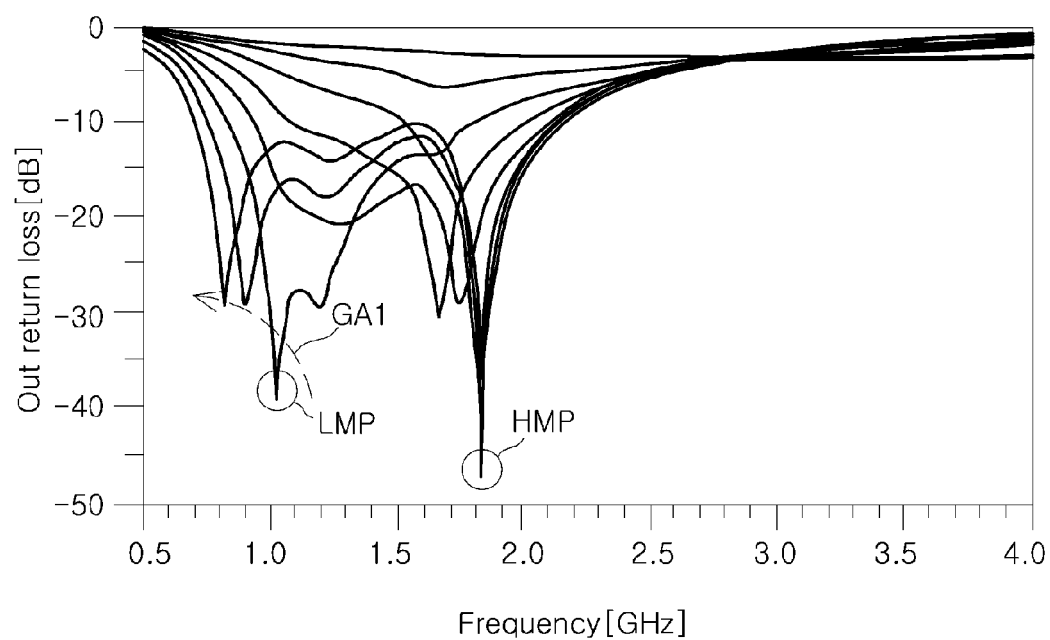
FIG. 7 is a graph illustrating output return loss characteristics in a case in which inductance of a first inductor is changed according to an exemplary embodiment of the present disclosure.
Figure 8:
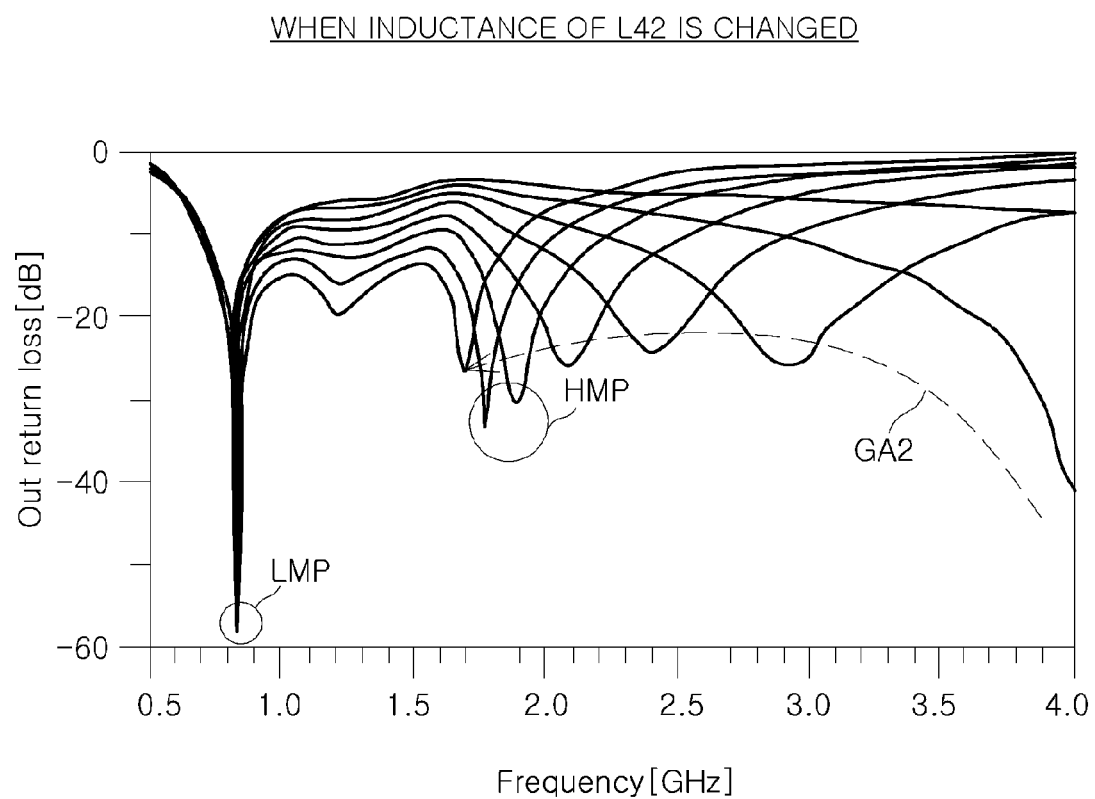
FIG. 8 is a graph illustrating output return loss characteristics in a case in which inductance of a second inductor is changed according to an exemplary embodiment of the present disclosure.

FIG. 7 is a graph illustrating output return loss characteristics in a case in which inductance of a first inductor is changed according to an exemplary embodiment of the present disclosure, and FIG. 8 is a graph illustrating output return loss characteristics in a case in which inductance of a second inductor is changed according to an exemplary embodiment of the present disclosure.

In FIG. 7, LMP is a low matching point and HMP is a high matching point. Referring to FIG. 7, output return loss was measured, while changing inductance of the first inductor L41 of the first output matching circuit 410, and it can be seen that the LMP was changed as illustrated by GA1 according to a change in inductance of the first inductor L41. In this case, the LMP may be positioned within a desired frequency by appropriately adjusting inductance of the first inductor L41.

In particular, referring to GA1 of FIG. 7, it can be seen that as inductance of the first inductor L41 is increased, the LMP is shifted to a low frequency band.

Also, in FIG. 8, LMP is a low matching point and HMP is a high matching point. Referring to FIG. 8, output return loss was measured, while changing inductance of the second inductor L42 of the second output matching circuit 420, and it can be seen that the HMP was changed as illustrated by GA2 according to a change in inductance of the second inductor L42. In this case, the HMP may be positioned within a desired frequency by appropriately adjusting inductance of the second inductor L42.

In particular, referring to GA2 of FIG. 8, it can be seen that as inductance of the second inductor L42 is increased, the LMP is shifted to a low frequency band.

Figure 9:
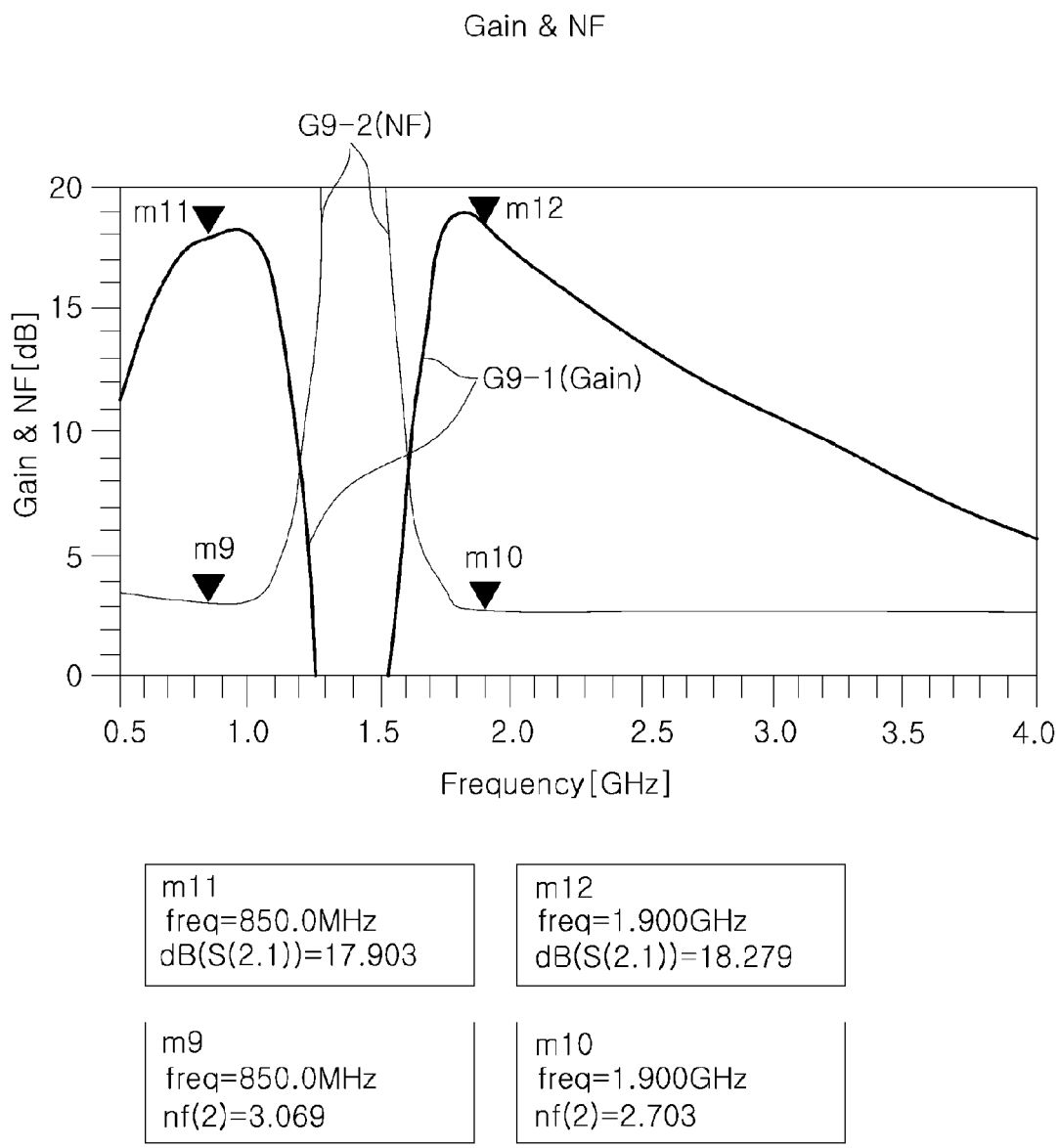
FIG. 9 is a graph illustrating gain and noise factor characteristics according to an exemplary embodiment of the present disclosure.
Figure 10:
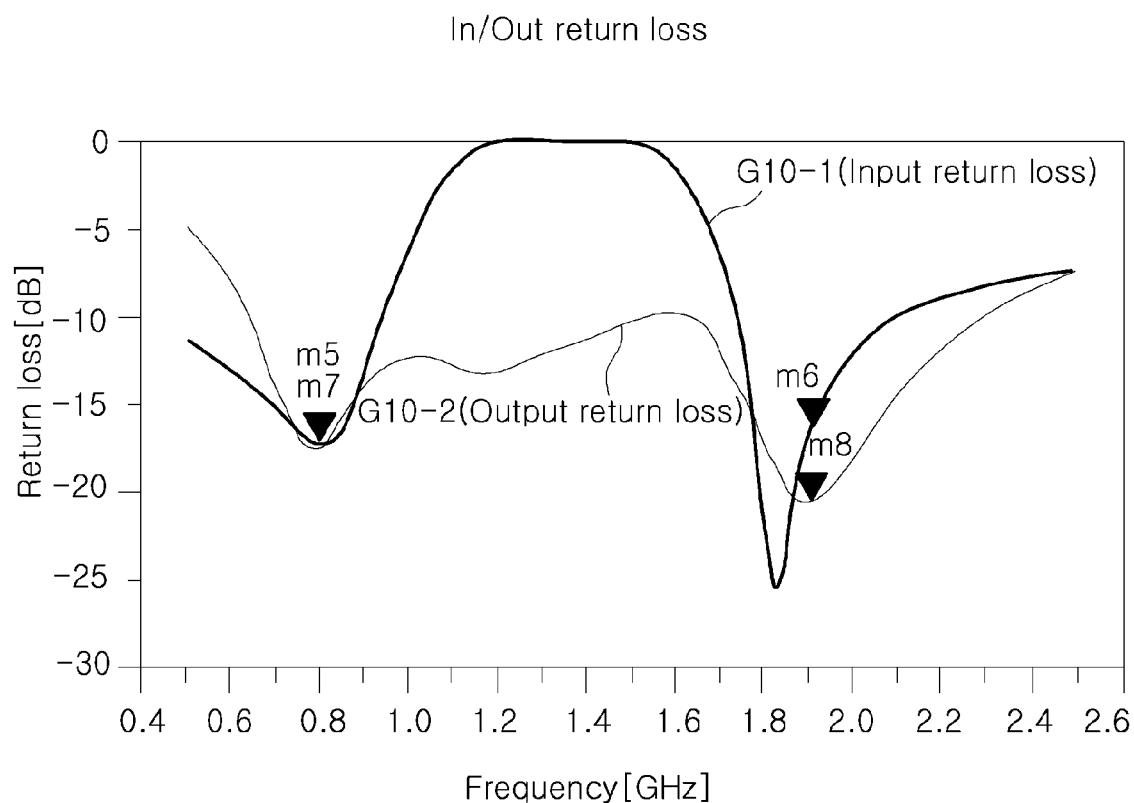
FIG. 10 is a graph illustrating input/output return loss characteristics according to an exemplary embodiment of the present disclosure.

FIG. 9 is a graph illustrating gain and noise factor characteristics according to an exemplary embodiment of the present disclosure, and FIG. 10 is a graph illustrating input/output return loss characteristics according to an exemplary embodiment of the present disclosure.

For example, the signal amplifier according to the exemplary embodiment of the present disclosure may operate as a concurrent dual-band low-noise amplifier operating in 850 MHz and 1900 GHz as domestic Korean LTE bands.

In FIG. 9, G9-1 is gain frequency characteristics, and G9-2 is noise factor (NF) frequency characteristics. In FIG. 10, G10-1 is input return loss characteristics and G10-2 is output return loss characteristics.

Referring to FIG. 9, gain is 17.9 dB and NF is 3.0 dB at 800 MHz, and gain is 18.3 dB and NF is 2.7 dB at 1900 MHz.

Also, referring to G10-1 and G10-2 in FIG. 10, an input/output return loss was lower than −10 dB and a current of 7.5 mA was consumed at an operating voltage of 1.8V.

As set forth above, according to exemplary embodiments of the present disclosure, by designing the inverted structure using the common source-type amplifier, excellent gain characteristics may be obtained, with current consumption being reduced.

While exemplary embodiments have been shown and described above, it will be apparent to those skilled in the art that modifications and variations could be made without departing from the spirit and scope of the present disclosure as defined by the appended claims.

What is claimed is:

1. A signal amplifier comprising:
   a first common source-type amplifying unit connected to a power supply terminal and amplifying a first band signal among input signals;
   a second common source-type amplifying unit connected to a ground terminal and amplifying a second band signal among the input signals; and
   an output matching unit performing impedance matching with respect to a first band between the first common source-type amplifying unit and an output terminal and performing impedance matching with respect to a second band between the second common source-type amplifying unit and the output terminal,
   wherein the first common source-type amplifying unit, the output matching unit, and the second common source-type amplifying unit form a single current path between the power supply terminal and the ground terminal.

2. The signal amplifier of claim 1, wherein the first common source-type amplifying unit includes a PMOS transistor having a source connected to the power supply terminal, a gate connected to a first gate voltage terminal and receiving the input signal, and a drain providing a signal to the output matching unit.

3. The signal amplifier of claim 1, wherein the second common source-type amplifying unit includes an NMOS transistor having a source connected to the ground terminal, a gate connected to a second gate voltage terminal and receiving the input signal, and a drain providing a signal to the output matching unit.

4. The signal amplifier of claim 1, wherein the output matching unit includes:
   a first inductor connected between an output terminal of the first common source-type amplifying unit and a common node and having inductance for first band matching;
   a second inductor connected between an output terminal of the second common source-type amplifying unit and the common node and having inductance for second band matching; and
   a shared capacitor connected between the common node and the output terminal of the output matching unit and having capacitance for the first and second band matching.

5. A signal amplifier comprising:
   a first common source-type amplifying unit connected to a power supply terminal and amplifying a first band signal among input signals;

a second common source-type amplifying unit connected to a ground terminal and amplifying a second band signal among the input signals; and an output matching unit performing impedance matching with respect to a first band between the first common source-type amplifying unit and an output terminal and performing impedance matching with respect to a second band between the second common source-type amplifying unit and the output terminal, wherein the first common source-type amplifying unit, the output matching unit, and the second common source-type amplifying unit have a cascode structure stacked between the power supply terminal and the ground terminal.

6. The signal amplifier of claim 5, wherein the first common source-type amplifying unit includes a PMOS transistor having a source connected to the power supply terminal, a gate connected to a first gate voltage terminal and receiving the input signal, and a drain providing a signal to the output matching unit.

7. The signal amplifier of claim 5, wherein the second common source-type amplifying unit includes an NMOS transistor having a source connected to the ground terminal, a gate connected to a second gate voltage terminal and receiving the input signal, and a drain providing a signal to the output matching unit.

8. The signal amplifier of claim 5, wherein the output matching unit includes:
a first inductor connected between an output terminal of the first common source-type amplifying unit and a common node and having inductance for first band matching;
a second inductor connected between an output terminal of the second common source-type amplifying unit and the common node and having inductance for second band matching; and
a shared capacitor connected between the common node and the output terminal of the output matching unit and having capacitance for the first and second band matching.

9. A signal amplifier comprising:
an input filter unit connected to an input terminal and allowing first and second band signals among input signals to pass therethrough;
a first common source-type amplifying unit connected to a power supply terminal and amplifying the first band signal;
a second common source-type amplifying unit connected to a ground terminal and amplifying the second band signal; and
an output matching unit performing impedance matching with respect to a first band between the first common source-type amplifying unit and an output terminal and performing impedance matching with respect to a second band between the second common source-type amplifying unit and the output terminal,
wherein the first common source-type amplifying unit, the output matching unit, and the second common source-type amplifying unit form a single current path between the power supply terminal and the ground terminal.

10. The signal amplifier of claim 9, wherein the input filter unit includes:
a first filter including an LC parallel circuit connected to a signal line connected to the input terminal, and allowing the first and second bands to pass therethrough and rejecting a frequency band between the first and second bands; and
a second filter including an LC series circuit connected between the signal line and a ground, and allowing the first and second bands to pass therethrough and bypassing a frequency band between the first and second bands to the ground.

11. The signal amplifier of claim 9, wherein the first common source-type amplifying unit includes a PMOS transistor having a source connected to the power supply terminal, a gate connected to a first gate voltage terminal and receiving the input signal, and a drain providing a signal to the output matching unit.

12. The signal amplifier of claim 9, wherein the second common source-type amplifying unit includes an NMOS transistor having a source connected to the ground terminal, a gate connected to a second gate voltage terminal and receiving the input signal, and a drain providing a signal to the output matching unit.

13. The signal amplifier of claim 9, wherein the output matching unit includes:
a first inductor connected between an output terminal of the first common source-type amplifying unit and a common node and having inductance for first band matching;
a second inductor connected between an output terminal of the second common source-type amplifying unit and the common node and having inductance for second band matching; and
a shared capacitor connected between the common node and the output terminal of the output matching unit and having capacitance for the first and second band matching.

14. A signal amplifier comprising:
an input filter unit connected to an input terminal and allowing first and second band signals among input signals to pass therethrough;
a first common source-type amplifying unit connected to a power supply terminal and amplifying the first band signal;
a second common source-type amplifying unit connected to a ground terminal and amplifying the second band signal; and
an output matching unit performing impedance matching with respect to a first band between the first common source-type amplifying unit and an output terminal and performing impedance matching with respect to a second band between the second common source-type amplifying unit and the output terminal,
wherein the first common source-type amplifying unit, the output matching unit, and the second common source-type amplifying unit have a cascode structure stacked between the power supply terminal and the ground terminal.

15. The signal amplifier of claim 14, wherein the input filter unit includes:
a first filter including an LC parallel circuit connected to a signal line connected to the input terminal, and allowing the first and second bands to pass therethrough and rejecting a frequency band between the first and second bands; and
a second filter including an LC series circuit connected between the signal line and a ground, and allowing the first and second bands to pass therethrough and bypassing a frequency band between the first and second bands to the ground.

16. The signal amplifier of claim 14, wherein the first common source-type amplifying unit includes a PMOS transistor having a source connected to the power supply terminal, a gate connected to a first gate voltage terminal and receiving the input signal, and a drain providing a signal to the output matching unit.

17. The signal amplifier of claim 14, wherein the second common source-type amplifying unit includes an NMOS transistor having a source connected to the ground terminal, a gate connected to a second gate voltage terminal and receiving the input signal, and a drain providing a signal to the output matching unit.

18. The signal amplifier of claim 14, wherein the output matching unit includes:
   a first inductor connected between an output terminal of the first common source-type amplifying unit and a common node and having inductance for first band matching;
   a second inductor connected between an output terminal of the second common source-type amplifying unit and the common node and having inductance for second band matching; and
   a shared capacitor connected between the common node and the output terminal of the output matching unit and having capacitance for the first and second band matching.

19. A signal amplifier comprising:
   an input filter unit connected to an input terminal and allowing first and second band signals among input signals to pass therethrough;
   a first common source-type amplifying unit connected to a power supply terminal and amplifying the first band signal;
   a second common source-type amplifying unit connected to a ground terminal and amplifying the second band signal; and
   an output matching unit including a first output matching circuit performing impedance matching with respect to a first band between the first common source-type amplifying unit and an output terminal and a second output matching circuit performing impedance matching with respect to a second band between the second common source-type amplifying unit and the output terminal,
   wherein the first common source-type amplifying unit, the output matching unit, and the second common source-type amplifying unit have an inverted structure stacked between the power supply terminal and the ground terminal, and
   the output matching unit includes:
   a first inductor connected between an output terminal of the first common source-type amplifying unit and a common node and having inductance for first band matching;
   a second inductor connected between an output terminal of the second common source-type amplifying unit and the common node and having inductance for second band matching; and
   a shared capacitor connected between the common node and the output terminal of the output matching unit and having capacitance for the first and second band matching.

20. The signal amplifier of claim 19, wherein the first common source-type amplifying unit includes a PMOS transistor having a source connected to the power supply terminal, a gate connected to a first gate voltage terminal and receiving the input signal, and a drain providing a signal to the output matching unit, and
   the second common source-type amplifying unit includes an NMOS transistor having a source connected to the ground terminal, a gate connected to a second gate voltage terminal and receiving the input signal, and a drain providing a signal to the output matching unit.

* * * * *